United States Patent
Liu et al.

(10) Patent No.: US 11,422,214 B2
(45) Date of Patent: Aug. 23, 2022

(54) GRADIENT COIL SYSTEM

(71) Applicant: Magnetica Limited, Eagle Farm (AU)

(72) Inventors: Feng Liu, Eagle Farm (AU); Riyu Wei, Eagle Farm (AU); Fangfang Tang, Eagle Farm (AU)

(73) Assignee: Magnetica Limited, Eagle Farm (AU)

( * ) Notice: Subject to any disclaimer, the term of this patent is extended or adjusted under 35 U.S.C. 154(b) by 0 days.

(21) Appl. No.: 17/294,487

(22) PCT Filed: Nov. 20, 2019

(86) PCT No.: PCT/AU2019/051276
§ 371 (c)(1),
(2) Date: May 17, 2021

(87) PCT Pub. No.: WO2020/118352
PCT Pub. Date: Jun. 18, 2020

(65) Prior Publication Data
US 2022/0011387 A1    Jan. 13, 2022

(30) Foreign Application Priority Data
Dec. 13, 2018   (AU) ................................ 2018904742

(51) Int. Cl.
*G01R 33/385* (2006.01)
*G01R 33/3875* (2006.01)
*G01R 33/421* (2006.01)

(52) U.S. Cl.
CPC ....... *G01R 33/385* (2013.01); *G01R 33/3875* (2013.01); *G01R 33/4215* (2013.01)

(58) Field of Classification Search
CPC .............. G01R 33/385; G01R 33/3875; G01R 33/4215; G01R 33/3873; A61B 5/0033; A61B 5/055
See application file for complete search history.

(56) References Cited

U.S. PATENT DOCUMENTS 4,733,189 A * 3/1988 Punchard ........... G01R 33/3875
324/318
5,307,039 A    4/1994 Charli et al.
(Continued)

FOREIGN PATENT DOCUMENTS

| EP | 0 695 950 A2 | 2/1996 |
|---|---|---|
| WO | WO 2016/025996 A1 | 2/2016 |
| WO | WO 2018/174726 A2 | 9/2018 |

OTHER PUBLICATIONS

International Preliminary Report on Patentability for PCT/AU2019/051276, dated Feb. 2, 2021, 5 pages.
(Continued)

*Primary Examiner* — Daniel R Miller
(74) *Attorney, Agent, or Firm* — Klarquist Sparkman, LLP

(57) ABSTRACT

A gradient coil system suitable for use in an MRI system. The gradient coil system having a gradient body having a bore extending therethrough and at least one frustoconical portion arranged about the bore. A diameter of a first end of the bore is greater than a diameter of a second end of the bore. The gradient coil system also includes a gradient coil assembly arranged about the bore having at least one frustoconical section substantially conforming to the at least one frustoconical portion of the body, the gradient coil assembly generating gradient fields in a Diameter of Spherical Volume (DSV) for medical imaging.

19 Claims, 11 Drawing Sheets

(56) References Cited

U.S. PATENT DOCUMENTS

| | | | |
|---|---|---|---|
| 5,416,415 A * | 5/1995 | Dorri | G01R 33/3815 |
| | | | 324/318 |
| 5,497,089 A * | 3/1996 | Lampman | G01R 33/385 |
| | | | 324/318 |
| 5,512,828 A | 4/1996 | Pausch et al. | |
| 7,605,587 B2 * | 10/2009 | Takeshima | A61B 5/055 |
| | | | 324/307 |
| 2005/0198812 A1 | 9/2005 | Schuster et al. | |
| 2006/0055406 A1 | 3/2006 | Lvovsky et al. | |
| 2007/0216411 A1 * | 9/2007 | Eberler | B22F 10/20 |
| | | | 324/318 |
| 2010/0237867 A1 * | 9/2010 | Slade | G01R 33/3873 |
| | | | 324/314 |
| 2015/0048832 A1 | 2/2015 | Kwon et al. | |
| 2015/0192650 A1 * | 7/2015 | Takamori | G01R 33/3854 |
| | | | 324/322 |
| 2017/0242084 A1 * | 8/2017 | Wei | H01F 6/06 |
| 2019/0187229 A1 * | 6/2019 | Overweg | G01R 33/385 |

OTHER PUBLICATIONS

International Search Report and Written Opinion for PCT/AU2019/051276, dated Jan. 30, 2020, 10 pages.

Fangang Tang et al., "A cone-shaped gradient coil design for high resolution MRI head imaging," Physics in Medicine & Biology, Institute of Physics and Engineering in Medicine, vol. 64, No. 8, Apr. 5, 2019, 11 pages.

Supplementary European Search Report for EP 19, 89, 6161, dated Dec. 23, 2021, 13 pages.

* cited by examiner

GRADIENT COIL SYSTEM

CROSS REFERENCE TO RELATED APPLICATIONS

This is the U.S. National Stage of International Application No. PCT/AU2019/051276, filed Nov. 20, 2019, which was published in English under PCT Article 21(2), which in turn claims the benefit of Australia Application No. 2018904742, filed Dec. 13, 2018.

The present invention relates to gradient coil systems for use in Magnetic Resonance Imaging (MRI) devices and apparatus. In particular, the invention relates to frustoconical gradient coil systems using shimming to improve imaging.

BACKGROUND

Any references to methods, apparatus or documents of the prior art are not to be taken as constituting any evidence or admission that they formed, or form, part of the common general knowledge.

Magnetic resonance imaging was introduced in the 1980s, and has developed into a major medical imaging modality.

Clinical MRI depends for its success on the generation of strong and uniform magnetic fields. MRI machines are designed to generate a static magnetic field that is required to be substantially homogeneous over a predetermined region, known in the art as the "diameter spherical imaging volume" or "DSV". Deviations from homogeneity of the static magnetic field over the DSV are typically required to be less than 20 parts per million peak-to-peak (or 1 parts per million rms).

MRI equipment has undergone a number of refinements since the introduction of the first closed cylindrical systems. In particular, improvements have occurred in quality/resolution of images through improved signal to noise ratios and introduction of high and ultra-high field magnets. Improved resolution of images, in turn, has led to MRI being a modality of choice for an increasing number of specialists for both structural anatomical and functional human MRI imaging.

The basic components of a typical magnetic resonance system for producing diagnostic images for human studies include a main magnet (usually a superconducting magnet which produces the substantially homogeneous static magnetic field (the Bo field) in the DSV), one or more sets of shim coils, a set of gradient coils, and one or more RF coils. Discussions of MRI, can be found in, for example, Haacke et al., *Magnetic Resonance Imaging: Physical Principles and Sequence Design*, John Wiley & Sons, Inc., New York, 1999. See also Crozier et al., U.S. Pat. No. 5,818,319, Crozier et al., U.S. Pat. No. 6,140,900, Crozier et al., U.S. Pat. No. 6,700,468, Dorri et al., U.S. Pat. No. 5,396,207, Dorri et al., U.S. Pat. No. 5,416,415, Knuttel et al., U.S. Pat. No. 5,646,532, and Laskaris et al., U.S. Pat. No. 5,801,609, the contents of which are incorporated herein in their entireties.

Whole body MRI magnets are typically cylindrical around 1.6-2.0 meters in length with axial apertures in the range of 0.6-0.8 meters. Normally the magnet is symmetric such that the midpoint of the DSV is located at the geometric centre of the magnet's structure along its main axis. Not surprisingly, many people suffer from claustrophobia when placed in such a space. Also, the large distance between the portion of the subject's body which is being imaged and the end of the magnet system means that physicians cannot easily assist or personally monitor a subject during an MRI procedure.

In addition to its effects on the subject, the size of the magnet is a primary factor in determining the cost of an MRI machine, as well as the costs involved in the installation of such a machine. Another important consideration is the volume of helium needed to maintain the system at cryogenic temperatures. Due to their large size, such whole body magnets are expensive for use in producing images of small sizes of objects, such as, heads, extremities and neonates, etc.

As mentioned above, gradient coils are essential system components in a magnetic resonance imaging (MRI) scanner, providing spatial encoding of the nuclear magnetic resonance (NMR) signals during scans. A strong and linear magnetic field gradient is required in fast imaging modalities such as diffusion-weighted imaging and echo planar imaging (EPI). Improvements in whole-body gradient strength can be simply achieved by adding more wire turns to the coils, however, this approach leads to increased inductance and resistance.

Gradient strength can also be improved by using stronger gradient amplifiers, but this method is not cost-effective. Using larger gradient power/currents can also lead to larger electric fields induced in the human body and cause peripheral nerve stimulation (PNS).

Another practical way to increase gradient strength is by applying local gradient coils such as insertable head coils within whole-body MRI systems. Insertable gradient coils have shown their advantages such as enhancing gradient strength and minimising inductance, exhibiting high switching speed and potentially higher PNS limits.

Geometrically, because the head access into the coil is limited by the dimensions of the shoulders, head gradient coils usually use an asymmetric configuration.

Thus, there is a need for improved coil systems for use in MRI systems.

OBJECT

It is an aim of this invention to provide a gradient coil system which overcomes or ameliorates one or more of the disadvantages or problems described above, or which at least provides a useful commercial alternative.

Other preferred objects of the present invention will become apparent from the following description.

SUMMARY

In a first aspect, the invention resides in a gradient coil system having one or more frustoconical shaped sections, one or more cylindrical sections having different radii or a combination of one or more frustonical shaped sections and one or more cylindrical sections.

In another aspect, the invention resides in a gradient coil system suitable for use in an MRI system, the gradient coil system comprising:

a gradient body having a bore extending therethrough and at least one frustoconical portion arranged about the bore, wherein a diameter of a first end of the bore is greater than a diameter of a second end of the bore; and a gradient coil assembly having at least one frustoconical section substantially conforming to the at least one frustoconical portion of the body.

Preferably, in use, a Diameter of Spherical Volume (DSV) associated with the system is shifted from a geometric centre of the system to allow easier imaging of both a head and extremities.

In some embodiments, the high efficiency (i.e. high slew rate and gradient strength) of the frustonical section of the gradient coil assembly provides a higher maximum scan speed (i.e. fast imaging).

In some embodiments, the gradient body of the system comprises one (or a single) frustoconical portion extending along a length of the bore between the first end and the second end.

Preferably, the body comprises at least one cylindrical portion arranged about the bore. Preferably, a cylindrical portion adjoins a frustoconical portion. Alternatively, or additionally, a first cylindrical portion having a diameter adjoins a second cylindrical portion having a diameter, wherein the diameter of the first cylindrical portion is greater than the diameter of the second cylindrical portion. Preferably, a plurality of frustoconical portions and/or cylindrical portions define a stepped-diameter bore.

In some embodiments, the gradient coil assembly comprises a primary coil structure having at least one substantially frustoconical section.

The gradient coil assembly may further comprise a shield layer structure having at least one substantially frustoconical section.

Preferably, the gradient body is located within a chamber of a magnet.

Preferably, the primary coil structure comprises first, second and third primary coil segments generating three orthogonal linear primary gradient fields in the DSV region. Preferably, the first primary coil segment comprises an axial coil generating a first primary gradient field along a longitudinal axis (z-axis). Preferably, the second and third primary coil segments each comprise a transverse coil rotated through 90 degrees in respect to each other thereby generating a second and third primary gradient field orthogonal to each other and the first primary gradient field. Preferably, the second primary coil segment is located between the first and third primary coil segments.

Preferably, the shield layer structure comprises a first, second and third shield coil segment. Preferably, each of the coil segments of the shield layer structure are arranged to generate an orthogonal gradient field opposite to the gradient field generated by a corresponding segment of the primary coil structure, thereby actively shielding the primary gradient fields and reduce the eddy currents in the magnet and in the DSV. Preferably, the shield layer structure is provided around the primary coil structure and extends substantially along the whole axial length of the bore. Preferably, a diameter of each of the shield coil segments is greater than a diameter of any one of the primary coil segments. The shield layer structure and associated coils act to shield the environment from the magnetic field generated by the magnetic coils.

Preferably, the diameter of the first end of the bore is greater than 500 mm to allow shoulder access. Preferably, the diameter of the second end of the bore is approximately 100 mm-500 mm. This provides increased efficiency and linearity of the magnetic field gradient, in addition to a shorter gradient length of the magnetic field (Bo) while still providing access for extremities.

Preferably, the shield coils are located remote from the primary coils. Preferably, the shield coils are frustoconical and/or cylindrical.

Preferably, the gradient coil system provides high efficiency, increased gradient strength and slew rate for head imaging and good linearity of the magnetic field gradient for short gradient length and is suitable for head and extremity access.

Preferably, the polarity of the coils of the primary coil structure is opposite to the polarity of the respective coils of the shield layer structure (i.e. they carry current in opposing directions).

Preferably, the system further comprises one or more shim pockets. Preferably, the shim pockets are frustoconical and/or cylindrical. Preferably, a shim portion is located in each shim pocket. Preferably, the shim portion comprises ferrous or ferromagnetic material. Preferably, each primary coil segment of the gradient coil assembly has an associated shim pocket and shim portion having a shape conforming to the shape of the gradient coil. Preferably, the shim portions passively shim the DSV to achieve a preferred field (Bo) homogeneity level. Preferably, the shim portion is located between the primary coil structure and the shield layer structure. In some embodiments, the shim portion is located outside of the shield layer structure. Preferably, the shim portion is located between the magnet and gradient coils.

Preferably, the system further comprises one or more active magnetic shimming devices.

In a preferred embodiment, the DSV has dimensions of 300 mm(x-)×300 mm(y-)×300 mm(z-). Preferably, the gradient coil assembly includes two frustoconical sections. Preferably, an angle of a first of the two frustonical sections is between 0 and 10 degrees and an angle of the second of the two frustoconical sections is between 5 and 30 degrees with respect to a longitudinal axis of the body. More preferably, the angle of the first of the two frustoconical sections is 5 degrees and the angle of the second of the two frustonical sections is 16 degrees relative to the longitudinal axis of the body.

Preferably, a diameter of the first end of the bore is between 500 mm and 600 mm and a diameter of the second end of the bore is between 100 mm and 500 mm. More preferably, the diameter of the first end of the bore is 600 mm and the diameter of the second end of the bore is 120 mm.

Preferably, a length of the second of the two frustoconical sections is greater than a length of the first of the two frustonical sections to increase efficiency and linearity of the magnetic field gradient. Preferably, the coil segments of the primary coil structure are arranged in the following order from the inside (adjacent the bore) to the outside (adjacent the shield layer structure): z primary coil, x primary coil and y primary coil. Preferably, the coil segments of the shield coil layer are arranged in the following order from the inside (adjacent the primary coil layer) to the outside (adjacent the magnet): x shield coil, y shield coil and z shield coil. Preferably, the bore comprises two frustoconical sections conforming to the two frustoconical sections of the gradient coil assembly.

In another preferred embodiment, the DSV has dimensions of 300 mm(x-)×300 mm(y-)×300 mm(z-). Preferably, the gradient coil assembly comprises three-stepped cylindrical sections, wherein each cylindrical section has a different diameter. Preferably, the gradient coil assembly comprises a frustonical section extending between two of the cylindrical sections. Preferably, a diameter of the first end of the bore is between 500 mm and 600 mm and a diameter of the second end of the bore is between 150 mm and 300 mm. More preferably, the diameter of the first end of the bore is 560 mm and the diameter of the second end of the bore is 210 mm. Preferably, the bore comprises three-stepped cylindrical sections conforming to the three-stepped cylindrical section of the gradient coil assembly.

Preferably, the gradient coil system further comprises one or more Radio Frequency (RF) coils are located between the gradient coil assembly and the bore. Preferably, the RF coils are frustoconical and/or cylindrical conforming to a shape of the bore. Preferably, the RF coils are located on an inner surface of the body surrounding the bore.

A gradient coil system suitable for use in an MRI system, the gradient coil system comprising:

a gradient body having a bore extending therethrough and at least one frustoconical portion arranged about the bore, wherein a diameter of a first end of the bore is greater than a diameter of a second end of the bore; and a gradient coil assembly arranged about the bore, the gradient coil assembly having at least one frustoconical section substantially conforming to the at least one frustoconical portion of the body, the gradient coil assembly generating gradient fields in a Diameter of Spherical Volume (DSV) for medical imaging.

Further features and advantages of the present invention will become apparent from the following detailed description.

BRIEF DESCRIPTION OF THE DRAWINGS

By way of example only, preferred embodiments of the invention will be described more fully hereinafter with reference to the accompanying figures, wherein.

DETAILED DESCRIPTION OF THE PREFERRED EMBODIMENTS

The present invention provides a gradient coil system with one or more cone shaped (or frustonical shaped) sections and, in some embodiments, one or more cylinder shaped sections. The present invention facilitates signal encoding of magnetic resonance images and enhancement of static magnetic field uniformity inside the DSV, and is particularly useful for human head, extremity and/or neonatal images, etc.

The gradient coil system has two ends, with one end having large bore diameter to allow shoulder access, and the other end having a significantly smaller bore diameter to improve the gradient efficiency and linearity of the magnetic field gradient, as well as shorten the gradient length.

The smaller gradient bore also allows extremity access for orthopaedic imaging.

In some embodiments, frustoconical or cylindrical passive/active shimming is included in the gradient system for shimming (i.e. homogenising) the magnetic field (Bo) in the region of the Diameter of Spherical Volume (DSV).

The gradient coil system comprises a gradient coil assembly having a primary layer structure with multiple frustoconical and/or cylindrical sections, and a shield layer structure that can be either frustoconical or cylindrical depending on the magnet configurations.

The primary layer structure includes three coil segments that generate three orthogonal linear gradient fields in the DSV region, one of which is referred to as the axial coil generating a gradient field along the longitudinal axis (z axis), and other two of which are referred to as transverse coils rotated through 90 degree in respect of each other.

The shield layer structure also includes three coil segments generating three orthogonal gradients fields opposite to the gradient fields generated by relevant primary coils, so as to actively shield the primary gradient fields and reduce the eddy currents in the magnet and in the DSV.

In the primary coils, the diameter of the wide bore is to be large enough to allow shoulder access, preferably larger than 500 mm, while the diameter of the narrow bore is envisaged to be small enough to have high efficiency and linearity of the magnetic field gradient as well as a shorter gradient length (relative to purely cylindrical systems), and still provide access for extremities. In this regard, it is envisaged that the narrow bore will be between 100 mm and 500 mm in diameter.

In order to improve or optimise shielding performance, the shield coils are located as far away as possible from the primary coils. As a result, the shield coil can be cylindrical for the cylindrical magnet bore.

Figure 1:
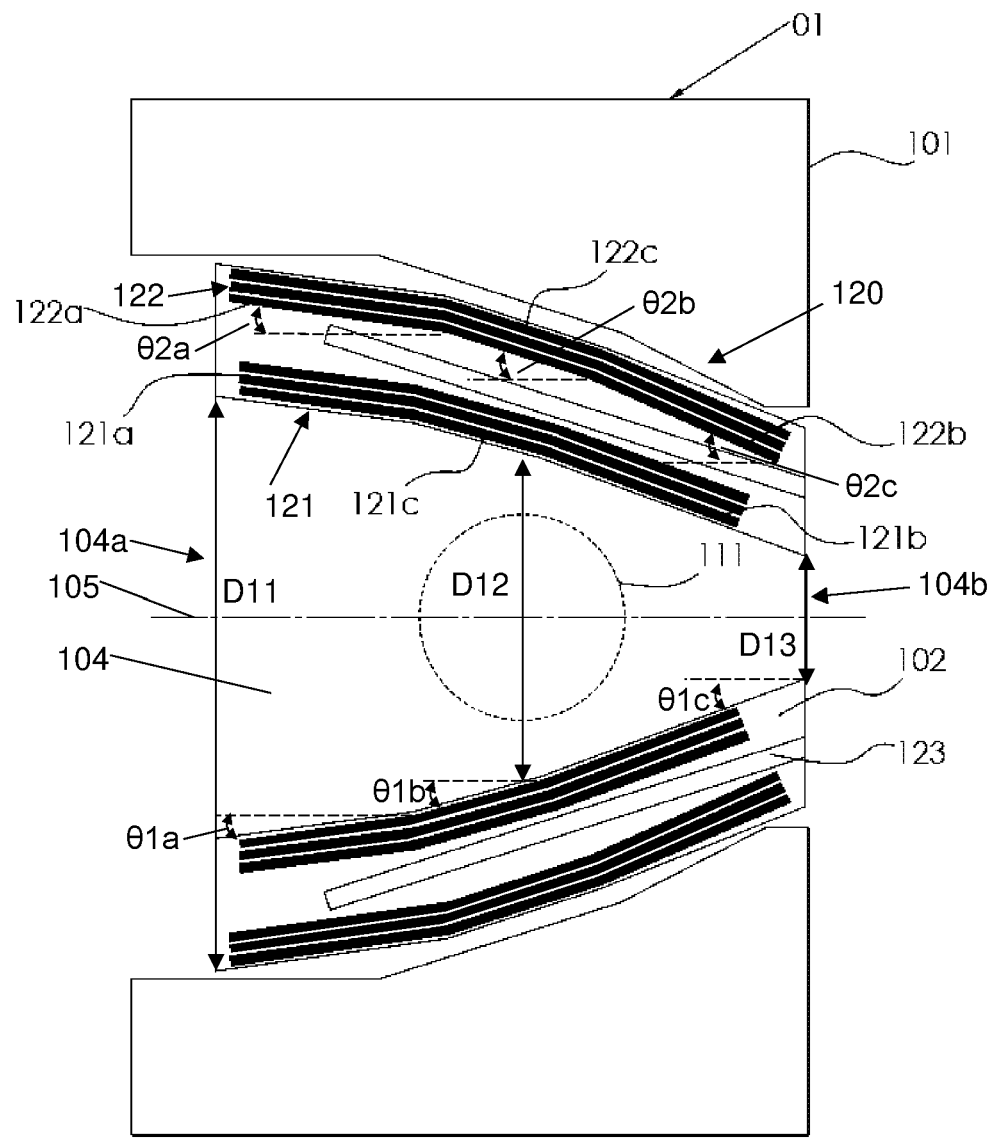
FIG. 1 illustrates a schematic cross-section view of a frustoconical gradient coil system in a magnet body according to a first embodiment of the present invention.

Turning now to FIG. 1, there is illustrated a frustoconical gradient coil system 01 for use in a Magnetic Resonance Imaging (MRI) system. The frustoconical gradient coil system 01 includes a frustoconical gradient body 102 inserted into the chamber, i.e. the axial opening, of a magnet 101 having an associated Diameter of Spherical Volume (DSV) 111.

The gradient body 102 defines a substantially frustoconical bore 104 which extends axially along the length of the gradient 102. As can be seen, the bore 104 includes a first opening 104a and a second opening 104b. The first opening 104a is intended to allow access for a patient's shoulders for imaging and must therefore be sized accordingly.

As briefly mentioned above, it is expected that the first opening 104a (i.e. the larger opening) will be suitably sized to allow access for a patient's shoulders. Thus, it is envisaged that the first opening 104a will have a diameter D11 of no less than 500 mm while the diameter D13 of the second opening 104b (i.e. the smaller opening) should be small enough to provide high efficiency and gradient linearity of the gradient field as well as a shorter gradient length, and still provide access for extremities, such as hands and arms, for example.

Located within the gradient body 102 is a gradient coil assembly 120. The gradient coil assembly 120 includes three frustoconical sections 121a, 121b, 121c that comprise a primary coil 121 and three frustoconical sections of shield coils 122a, 122b, 122c that comprise a shield coil 122. There is also a frustoconical passive shimming device 123 which includes a shim pocket housing one or more shim portions. The shim portion provides passive shimming of the magnetic field and comprise a ferromagnetic material.

Each primary coil section 121a, 121b, or 121c has a different angle 81a, 81b, 81c to the longitudinal axis 105 of the magnet 101 and a different average diameter D11, D12, D13. However, the angles 82a, 82b, 82c of each shield coil section 122a, 122b, 122c may either be the same or different. Advantageously, the various configurations provided by the different angles of the primary coil sections 121a-c and shield coil sections 122a-c generate optimal and desired magnetic fields in the DSV and minimise stray magnetic fields.

As described with regard to the first opening 104a of the bore 104, the diameter of the innermost primary coil section, primary coil 121a is spaced wide enough to allow access of shoulders of a patient. Thus, as with the first opening 104a, it is preferred that the primary coil 121a has a maximum diameter of no less than 500 mm but it is conceivable that the primary coil 121a could be any size.

Each of the primary coil 121 and the secondary coil 122 respectively include three coil segments (z, x and y coils) generating three orthogonal gradient fields in three orthogonal z, x and y axes.

The electric current directions in the shield coils 122 are opposite to those in the respective primary coils 121. This will be illustrated more clearly in later figures relating to further embodiments.

As shown, the primary coil 121 and shield coil 122 are sufficiently spaced apart for the passive shim pockets 123 to extend therebetween from the narrow end of the gradient body 102 (adjacent the second opening 104b) into the wide section (adjacent the first opening 104a) of the gradient body 102.

By locating the passive shim pockets 123 between the primary coil 121 and the shield coil 122, shim portions may be located in the shim pockets 123 to thereby shim the magnet DSV 111 to a desired field homogeneity level.

Figure 2:
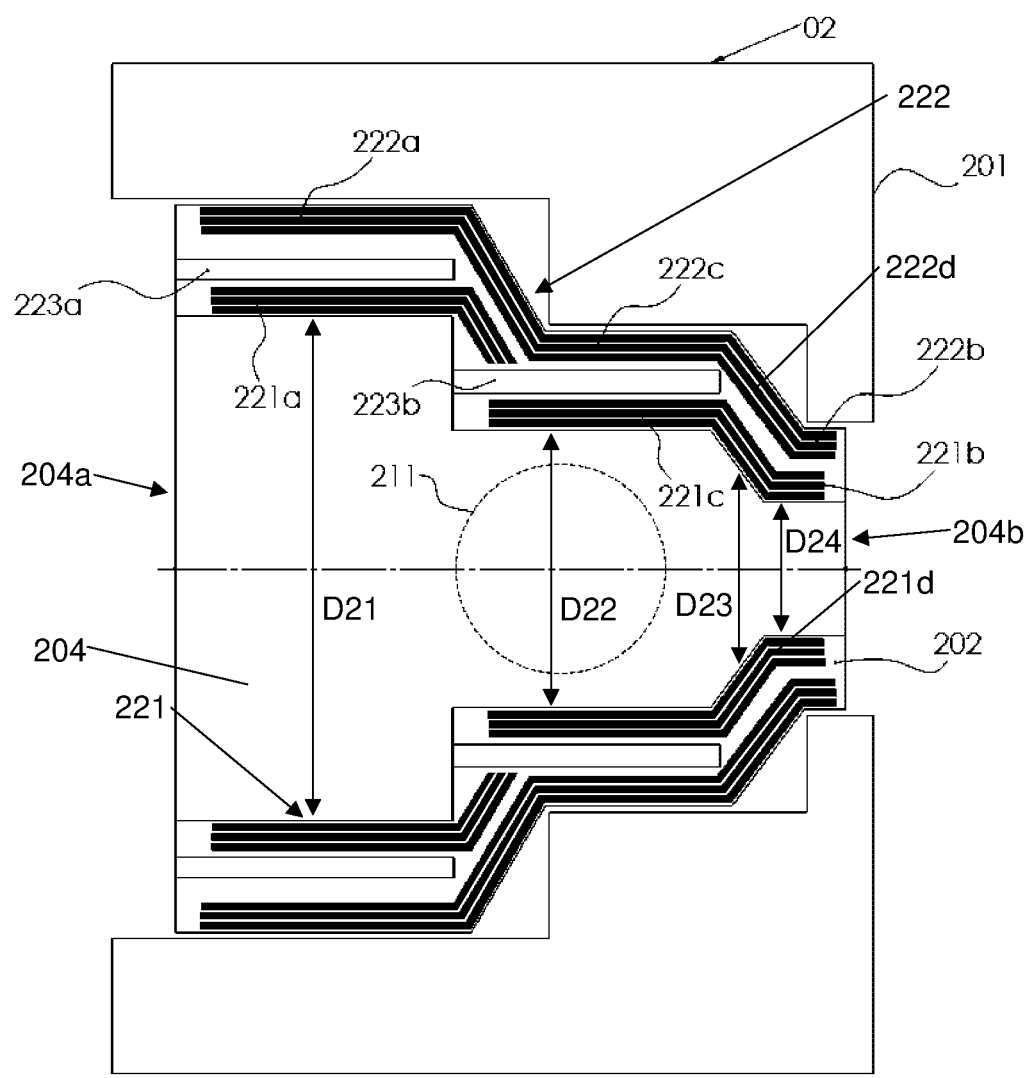
FIG. 2 illustrates a schematic cross-section view of a stepped gradient coil system having frustoconical and cylindrical portions according to a second embodiment of the present invention.

Gradient coil system 02, shown in FIG. 2, includes a three-step gradient body 202 which is inserted into a chamber (i.e. the axial opening) of a magnet 201 having an associated Diameter of Spherical Volume (DSV) 211.

The gradient body 202 defines a stepped bore 204 which extends axially along the length of the gradient body 202. As can be seen, the bore 204 includes a first opening 204a and a second opening 204b.

The first opening 204a is intended to allow access for a patient's shoulder for imaging and must therefore be sized accordingly. As described above in relation system 01, it is expected that the first opening 204a (i.e. the larger opening) will be no less than 500 mm in diameter while the second opening 204b (i.e. the smaller opening) should be small enough to provide high efficiency and gradient linearity of the gradient field as well as a shorter gradient length, and still provide access for extremities, such as hands and arms, for example.

Located within the gradient body 202 there are three stepped cylindrical primary coil sections 221a, 221b, 221c and a frustoconical primary coil section 221d that comprise a primary coil 221 and three stepped cylindrical shield coil sections 222a, 222b, 222c and a frustoconical shield coil section 222d that comprise a shield coil 222.

In addition, there are two stepped cylindrical passive shimming device 223a and 223b. Each shimming device 223a, 223b is substantially similar to the shimming device 123 described above having a shim pocket housing one or more shim pieces of a ferromagnetic material.

As can be seen the sections primary coil section 221a and shield coil section 222a, and primary coil section 221c and shield coil section 222c are radially separated and spaced about the bore 204 in order to provide room for the shim devices 223a, 223b to be respectively located therebetween. As described above, shim pieces located in the shim pockets of shimming device 223a and 223b work together to shim the magnet DSV 211 to the required field homogeneity level (e.g., 10 ppm in a 300 mm DSV).

Each step of primary coil section 221a, 221b, 221c, 221d respectively has a portion with a different average diameter D21, D22, D23, D24.

The diameter D21 of section 221a should be large enough to allow access of patient's shoulders and the diameter D24 of section 221c should be large enough to allow extremity access.

While each step of primary coil section 221a-c is different in diameter D21-D24, the diameter of each shield coil section 222a-c may optionally either be different or substantially equal.

Each section of the gradient coil 220, including both primary coil 221 and shield coil 222, includes three coil segments referred to as z, x and y coils generating three orthogonal gradient fields in three orthogonal z, x and y axes.

The electric current directions in the shield coils 222a-c are opposite to those in the respective primary coils 221a-c.

Figure 3:
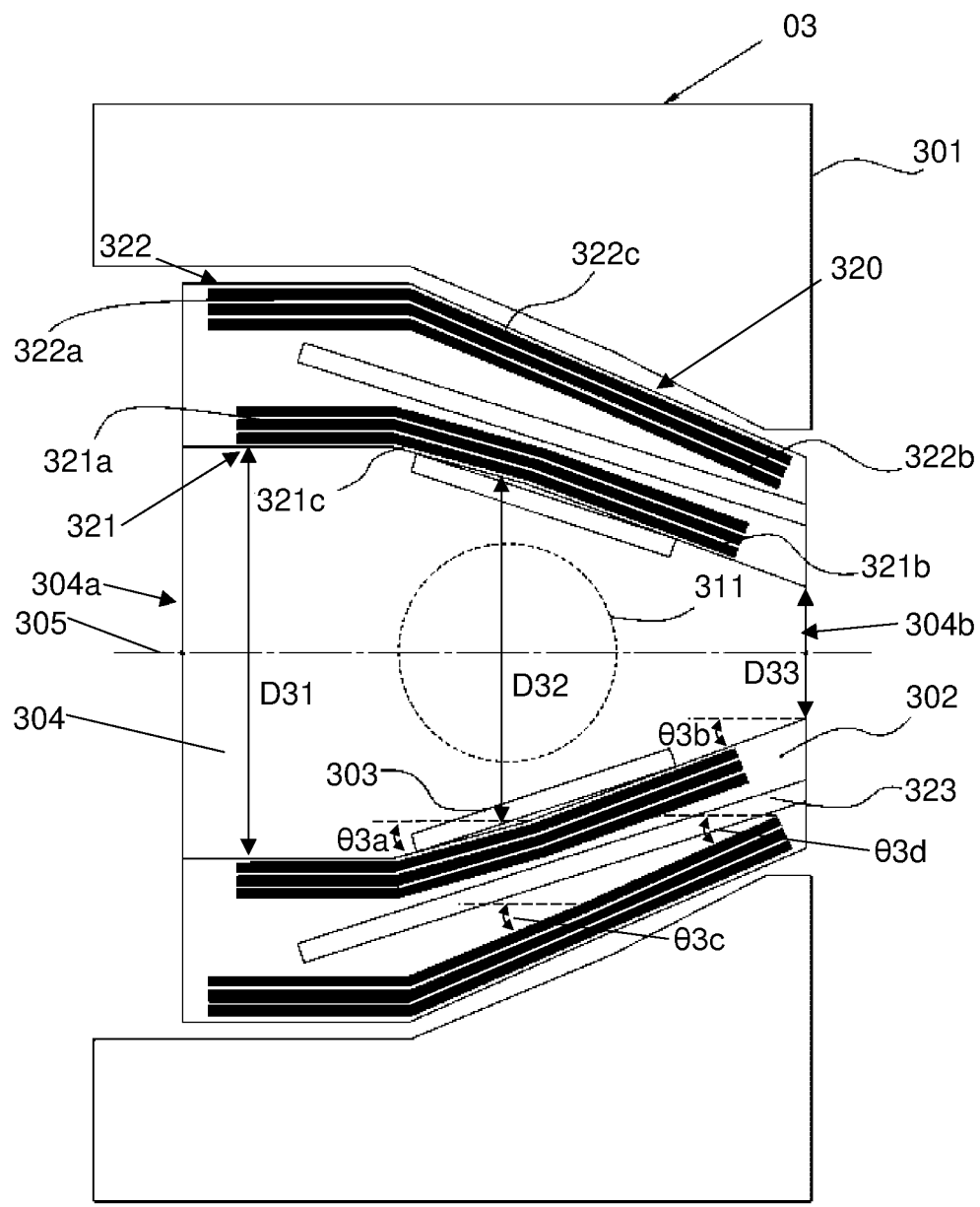
FIG. 3 illustrates a schematic cross-section view of a frustoconical gradient coil system having frustoconical Radio Frequency (RF) coils in a magnet body according to a third embodiment of the present invention.

Referring to FIG. 3, there is a further embodiment of the present invention in the form of frustoconical gradient coil system 03. Frustonical gradient coil system 03 is substantially similar to frustoconical gradient coil system 01 described above. However, primary coil section 321a is parallel to the longitudinal axis 305 of the magnet 301, in contrast to primary coil section 121a of system 01 which is angled.

The frustoconical gradient coil system 03 includes a frustoconical gradient body 302 inserted into the chamber, i.e. the axial opening, of a magnet 301 having an associated Diameter of Spherical Volume (DSV) 311.

The gradient body 302 defines a substantially frustoconical bore 304 which extends axially along the length of the gradient 302. As can be seen, the bore 304 includes a first opening 304a and a second opening 304b. The first opening 304a is intended to allow access for a patient's shoulders for imaging and must therefore be sized accordingly.

As briefly mentioned above, it is expected that the first opening 304a (i.e. the larger opening) will be suitably sized to allow access for a patient's shoulders. Thus, it is envisaged that the first opening 304a will have a diameter D31 of no less than 500 mm while the diameter D33 of the second opening 304b (i.e. the smaller opening) should be small enough to provide high efficiency and gradient linearity of the gradient field as well as a shorter gradient length, and still provide access for extremities, such as hands and arms, for example.

Located within the gradient body 302 is a gradient coil assembly 320. The gradient coil assembly 320 includes three frustoconical sections 321a, 321b, 321c that comprise a primary coil 321 and three frustoconical sections of shield coils 322a, 322b, 322c that comprise a shield coil 322. There is also a frustoconical passive shimming device 323 which includes a shim pocket housing one or more shim portions. The shim portion provides passive shimming of the magnetic field and comprise a ferromagnetic material.

Primary coil sections 322c, 322b each have a different respective angle θ3a, θ3b to the longitudinal axis 305 of the magnet 301 and a different average diameter D31, D32, D33. However, the angles 83c, 83d of respective shield coil sections 322c, 322b may either be the same or different. Advantageously, the various configurations provided by the different angles of the primary coil sections 321a-c and shield coil sections 322a-c generate optimal and desired magnetic fields in the DSV and minimise stray magnetic fields.

As described with regard to the first opening 304a of the bore 304, the diameter of the innermost primary coil section, primary coil 321a is spaced wide enough to allow access of shoulders of a patient. Thus, as with the first opening 304a, it is preferred that the primary coil 321a has a maximum diameter of no less than 500 mm, but it is conceivable that the primary coil 321a could be any size.

Each of the primary coil 321 and the shield coil 322 respectively include three coil segments (z, x and y coils) generating three orthogonal gradient fields in three orthogonal z, x and y axes.

The electric current directions in the shield coils 322 are opposite to those in the respective primary coils 321. This will be illustrated more clearly in later figures relating to further embodiments.

As shown, the primary coil 321 and shield coil 322 are sufficiently spaced apart for the passive shim pockets 323 to extend therebetween from the narrow end of the gradient body 302 (adjacent the second opening 304b) into the wide section (adjacent the first opening 304a) of the gradient body 102.

By locating the passive shim pockets 323 between the primary coil 321 and the shield coil 322, shim portions may be located in the shim pockets 323 to thereby shim the magnet DSV 311 to a desired field homogeneity level.

Furthermore, frustoconical gradient coil system 03 also includes frustoconical Radio Frequency (RF) coils 303 located on an inner surface of the bore 304 extending through the gradient body 302. It will be appreciated that the RF coils may be either volume coils, surface coils or a combination of the two.

These frustoconical RF coils 303 are configured as receivers adapted to receive radio frequency signals of a magnetic resonance imaging system.

Similar to system 01, each primary coil 321 and shield coil 322 respectively includes three coil segments (z, x and y coils) generating three orthogonal gradient fields in three orthogonal z, x and y axes. The electric current directions in the shield coils 322a-c are opposite to those in the respective primary coils 321a-c.

Figure 4:
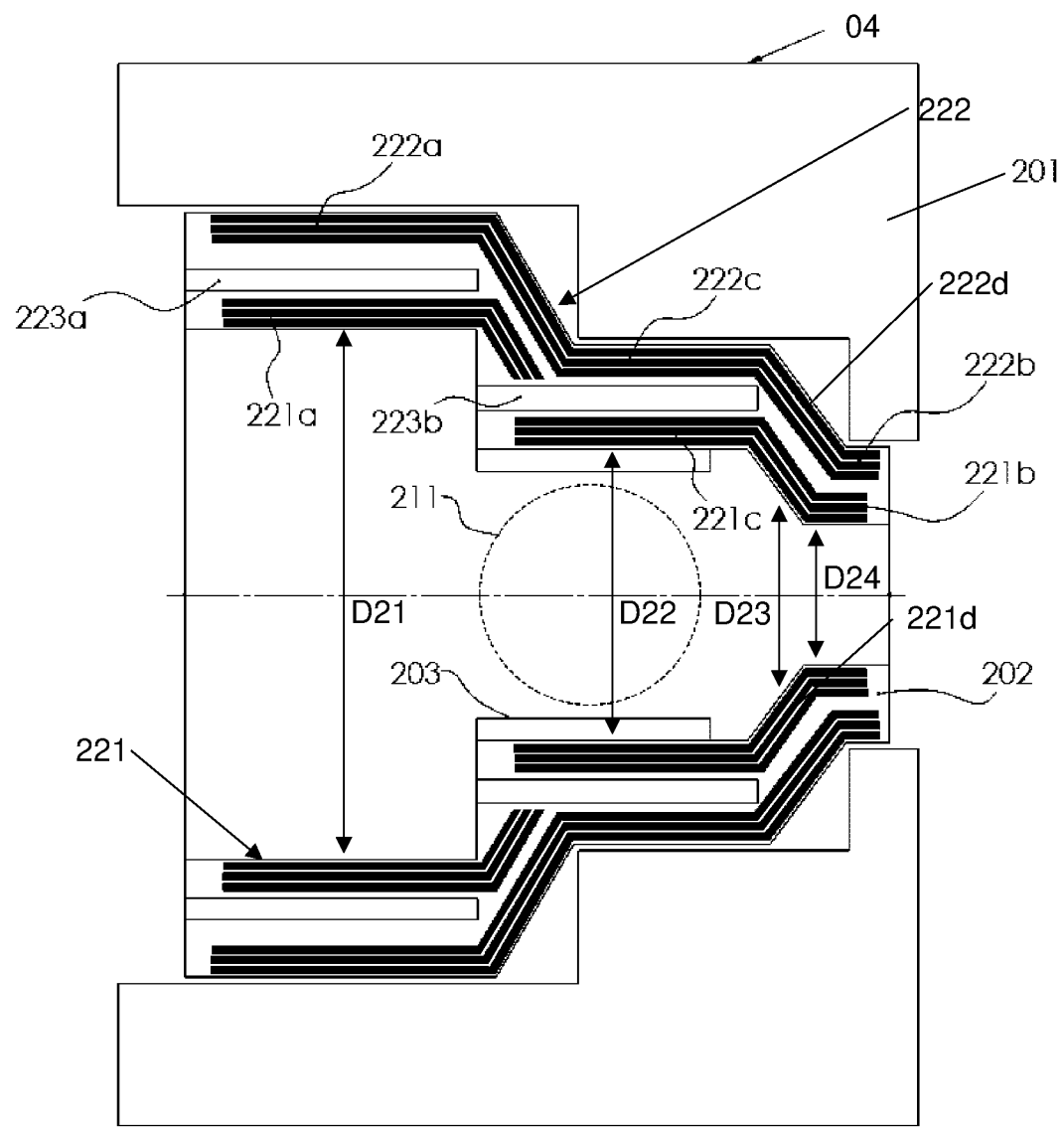
FIG. 4 illustrates a schematic cross-section view of a stepped gradient coil system having cylindrical RF coils according to a fourth embodiment of the present invention.

Another embodiment of the present invention in the form of stepped gradient coil system 04 is shown in FIG. 4.

Stepped gradient coil system 04 is substantially similar to gradient coil system 02 described above and shown in FIG. 2. However, stepped gradient coil system 04 additionally includes frustoconical Radio Frequency (RF) coils 203 located on an inner surface of the bore 204 extending through the gradient body 202.

These frustoconical RF coils 203 are configured as receivers adapted to receive radio frequency signals of a magnetic resonance imaging system.

As with the embodiments described herein, the electric current directions in the shield coils 222a-c are opposite to those in the respective primary coils 221a-c.

Figure 5:
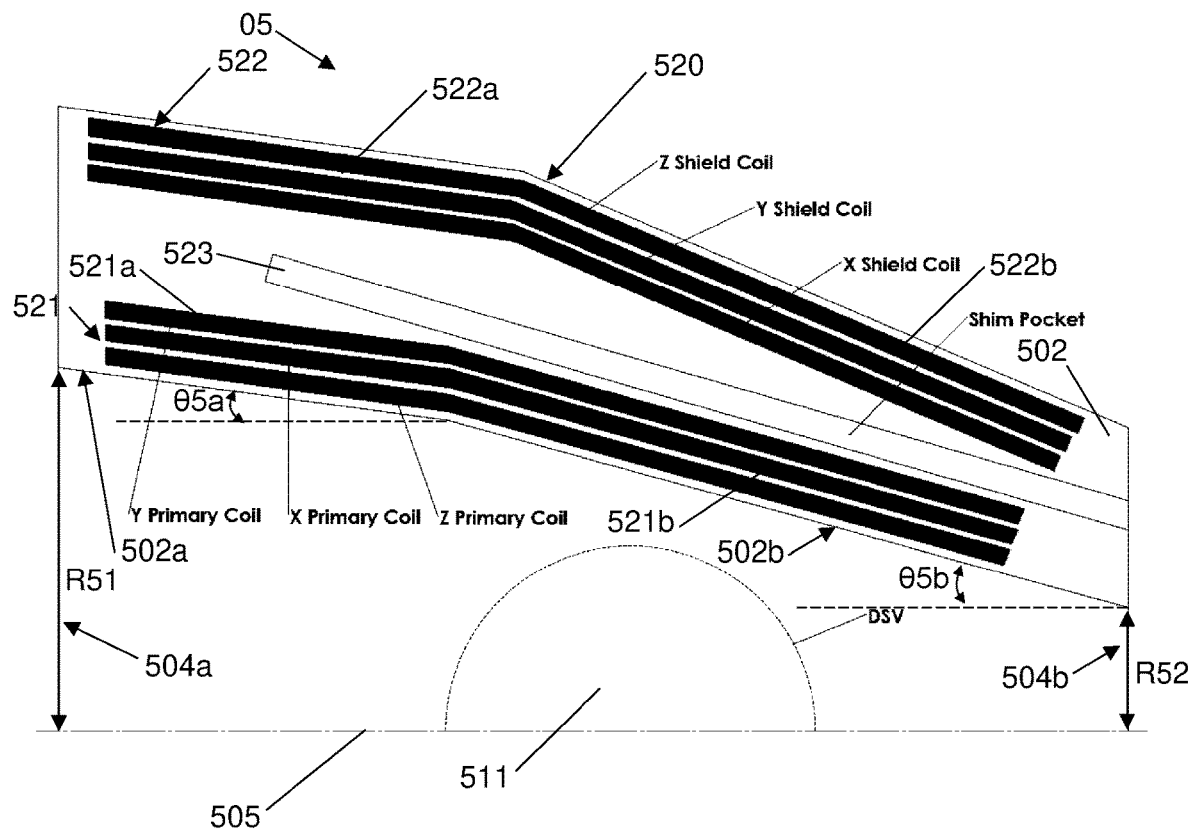
FIG. 5 illustrates a schematic cross-section of a frustoconical gradient coil system having two frustoconical portions according to a fifth embodiment of the present invention.

In a particularly preferred embodiment, shown in FIG. 5, the DSV 511 of a frustonical gradient coil system 05, which is substantially similar to gradient coil system 01, has dimensions of 300 mm(x-)×300 mm(y-)×300 mm(z-).

The gradient coil system 05 includes two frustoconical sections: a wide section 502a and a narrow section 502b formed in a gradient body 502.

The gradient coil assembly 520 includes two frustoconical sections 521a and 521b that comprise a primary coil 521 and two frustoconical sections of shield coils 522a and 522b that comprise a shield coil 522.

The angle 85a of the wide section 502a is equal to 5 degrees and the angle θ5b of the narrow section 502b is equal to 16 degrees with respect to the axial direction of the gradient (represented by line 505).

The maximum radius R51 of the widest gradient bore 504a is 300 mm (equal to a diameter of 600 mm) and the minimum radius R52 of the narrowest bore 504b is 60 mm (equal to a diameter of 120 mm).

In this particularly preferred embodiment, the length of the narrow section 502b is significantly longer than that of the wide section 502a to increase both efficiency and linearity of the magnetic field of the system 05.

As can be seen in the illustrated figure, the primary coil 521 and shield coil 522 are arranged in the order from the inside to the outside: z primary coil, x primary coil, y primary coil, x shield coil, y shield coil, and then z shield coil.

The shim device 523, which is substantially similar to the shim device 123 described above, is located between the primary coil 521 and shield coil 522.

Figure 6:
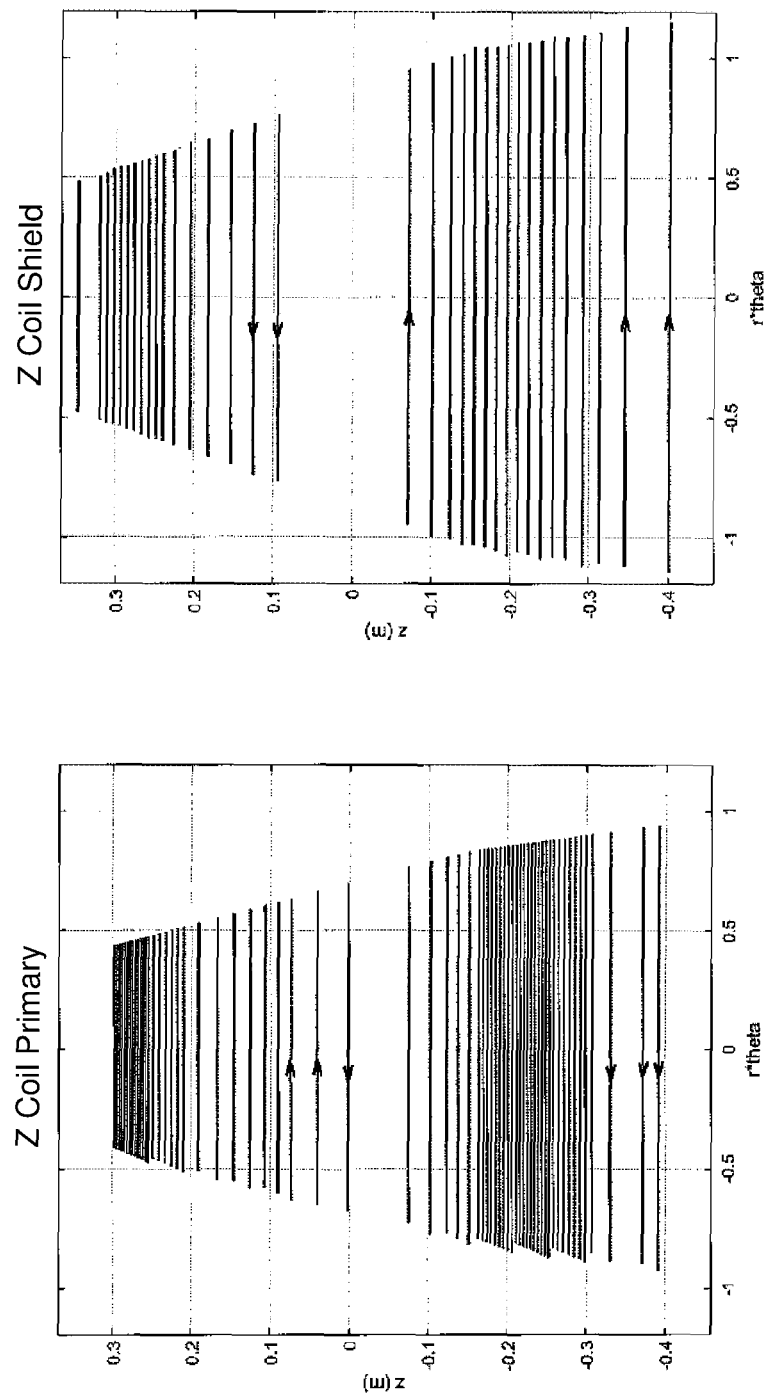
FIG. 6 illustrates the axial (z) coil primary and shield patterns of the frustoconical gradient coil system shown in FIG. 5.
Figure 7A:
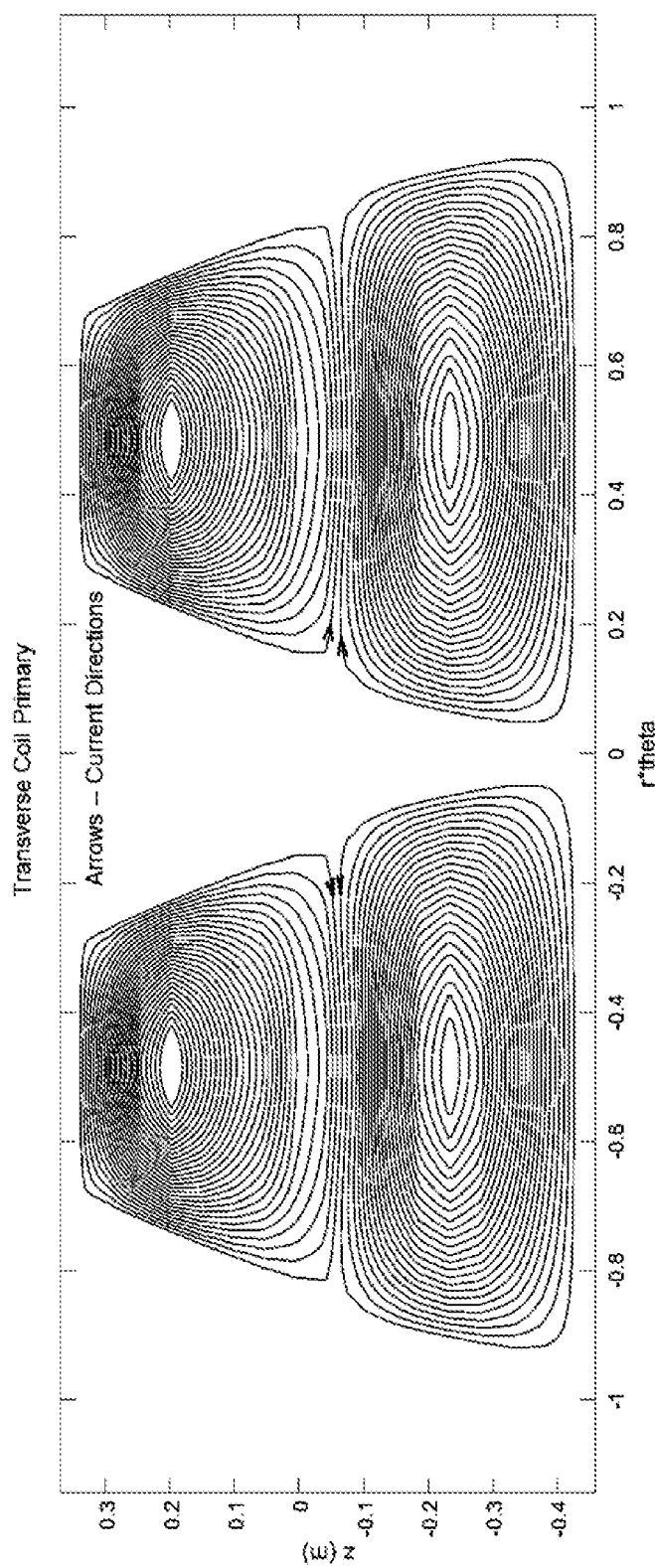
FIGS. 7a and 7b illustrate the transverse (x and y) coil primary and shield patterns of the frustoconical gradient coil system of FIG. 5.
Figure 7B:
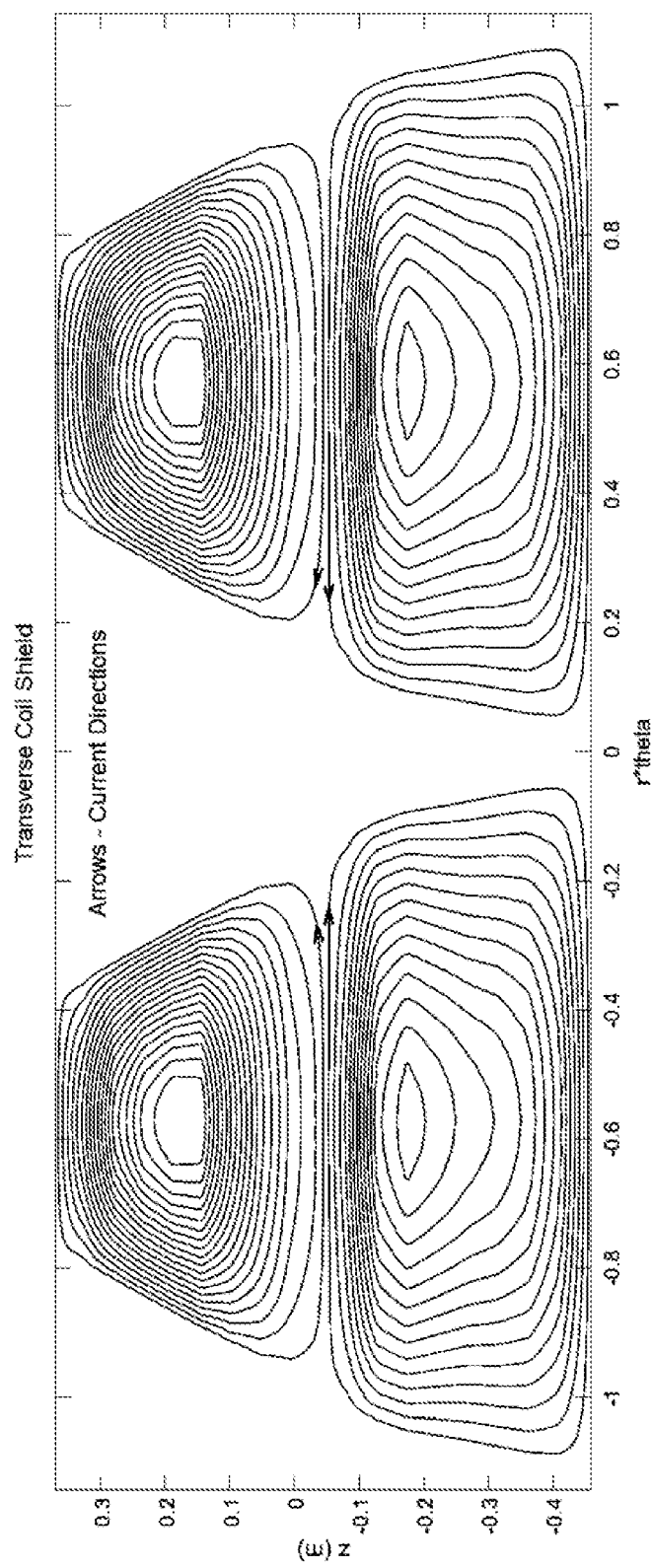

The electric current directions (illustrated in FIGS. 6, 7a and 7b) in the shield coils 522 are opposite to those in the respective primary coils 521.

In use, the above described embodiment provides high efficiency and linearity of the magnetic field gradient. In addition, system 05 provides adequate access for a patient's shoulders using the smaller angle of 5 degrees at a first end and a larger angle of 16 degrees at a second end.

Figure 8:
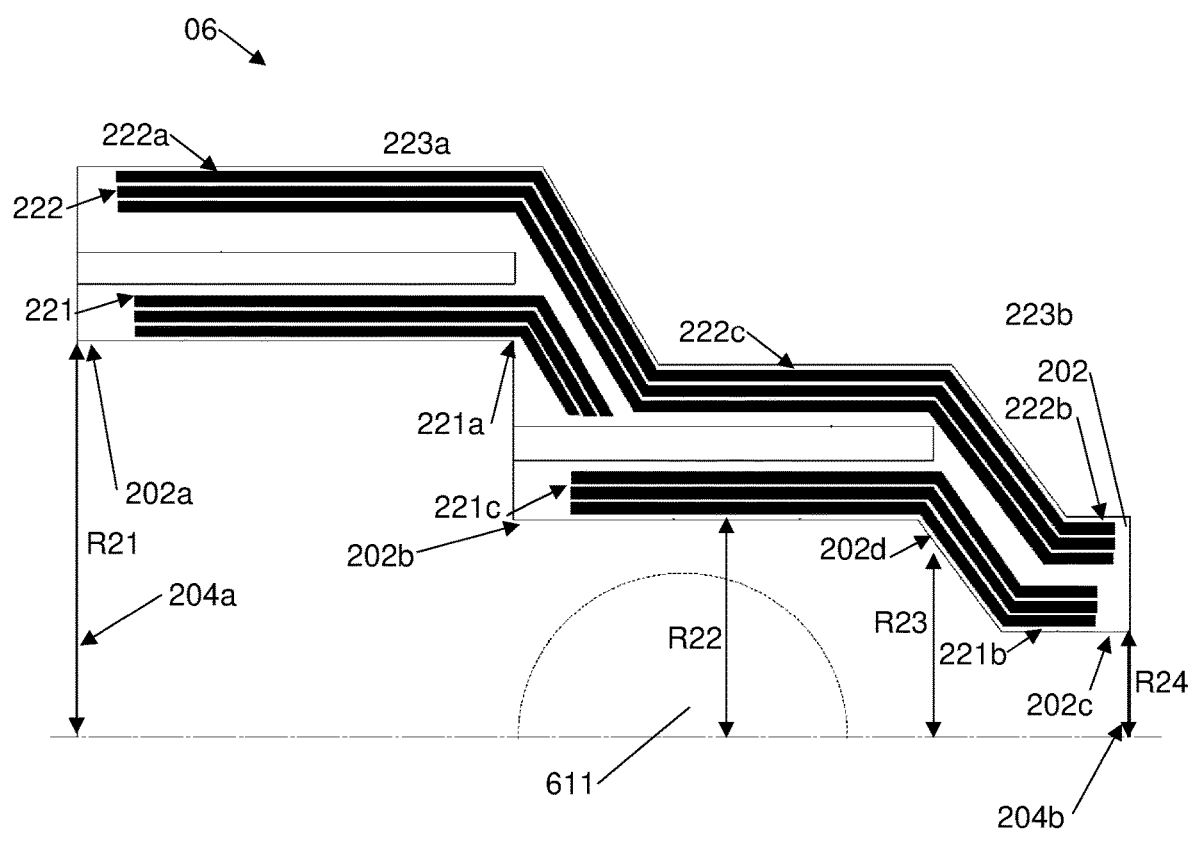
FIG. 8 illustrates a section of the stepped gradient coil system shown in FIG. 2.

In another particularly preferred embodiment according to FIG. 8, the three-step gradient coil system 06, which is substantially similar to three-step gradient coil system 02 and uses many similarly numbered components, has a DSV 611 with dimensions of 300 mm(x-)×300 mm(y-)×300 mm(z-).

As described above, the gradient coil assembly 220 includes three-stepped cylindrical sections 202a, 202b, 202c and a frustoconical section 202d located between cylindrical sections 202b and 202c. Each of the sections 202a-d has a different radius R21, R22, R23, R24, respectively.

The radius R21 of the widest gradient bore 204a is 280 mm (equivalent to a diameter of 560 mm) and the radius R24 of the narrowest bore 204b is 105 mm (equivalent to a diameter of 210 mm).

The primary coil 221 and shield coil 222 are arranged in the order from the inside (adjacent the bore 204) to the outside (moving radially outward from the bore 204): z primary coil, x primary coil, y primary coil, x shield coil, y shield coil and then z shield coil, which can be clearly seen in the illustration.

Figure 9:
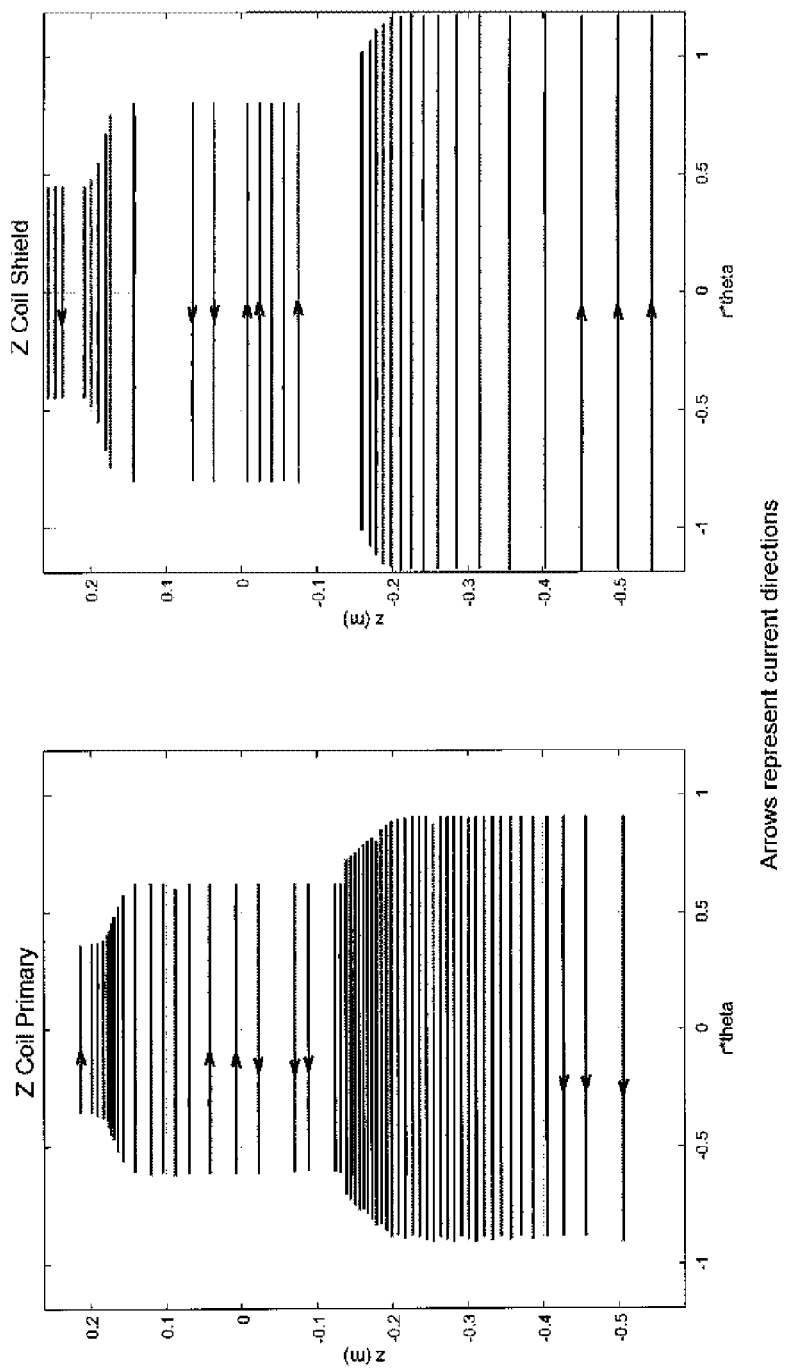
FIG. 9 illustrates the axial (z) coil primary and shield patterns of the stepped gradient coil system shown in FIG. 8.
Figure 10:
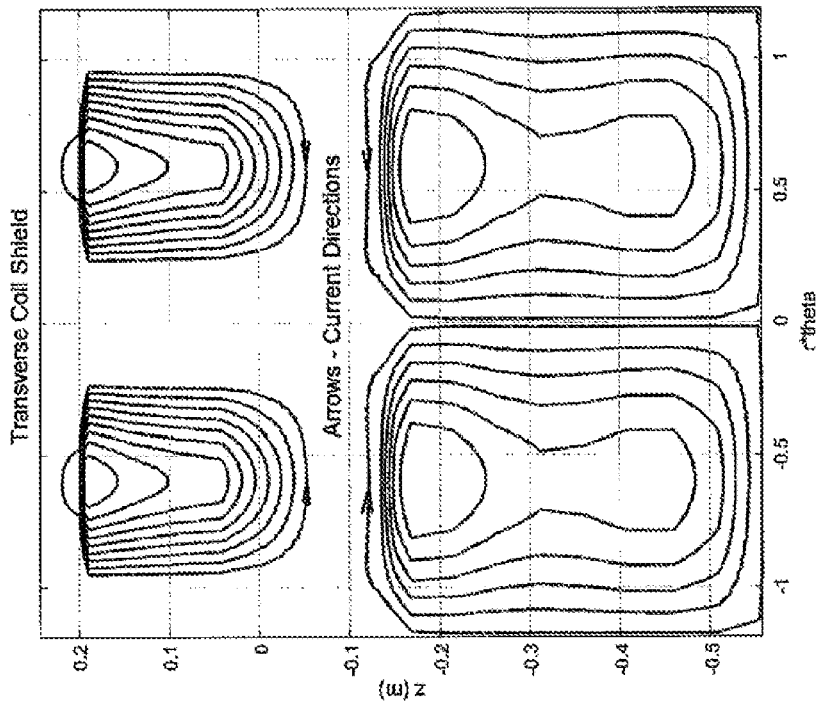
FIG. 10 illustrates the transverse (x and y) coil primary and shield patterns of the stepped gradient coil system of FIG. 8.
Figure 10:
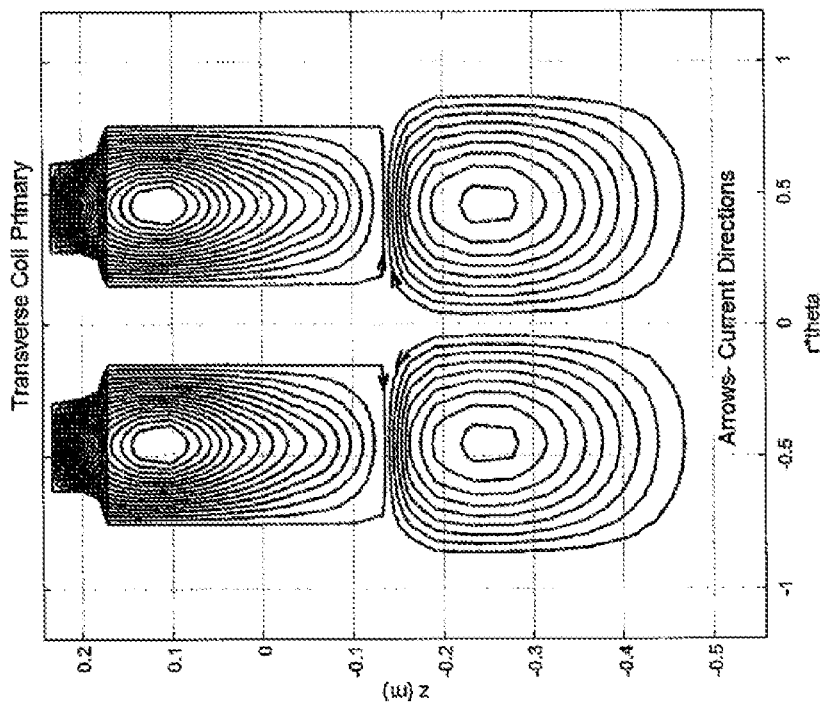

The electric current directions (illustrated in FIGS. 9 and 10) in the shield coils 222 are opposite to those in the respective primary coils 221.

In use, system 06 described above provides access for both shoulders of a patient at the widest gradient bore 204a and extremities at the narrowest bore 204b while maintaining high efficiency and linearity of magnetic field.

In some embodiments, the larger opening (relative to cylindrical systems) provided by the frustoconical bore can reduce the overall length of the magnet required in the system.

While the embodiments described herein include passive magnetic shimming device, alternative embodiments may also include active magnetic shimming device.

Embodiments of the invention described herein aim to provide high efficiency, high gradient strength and thus improved slew rate for head imaging, improved linearity for a shortened gradient length and a system suitable for head and extremity access. As it will likely be appreciated, increased gradient strength and high slew rates can be particularly important (and often necessary) for cardiac and head (i.e. brain) imaging.

Furthermore, embodiments of the present invention having multiple sections of frustoconical gradient coils with different angles and diameters, including shimming providing efficient and high speed spatial encoding of Nuclear Magnetic Resonance (NMR) signals and easy access into the MRI system for both shoulders and extremities.

Embodiments of the invention having primary coil sections positioned at different angles generate optimal magnetic fields in the DSV and minimise stray magnetic fields.

Advantageously, the frustoconical nature of the components described above in relation to the various embodiments of the invention allows the DSV to be shifted from the centre of the bore. This is in contrast to the DSV of typical cylindrical designs which typically have a DSV located centrally. In the embodiments of the invention described herein, this allows easier positioning of a patient for head imaging (from the large end) and extremity imaging (from the narrow end) within the imaging zone.

In a further advantage, the frustoconical design of embodiments of the invention allows for a smaller magnet to be used, thereby reducing power consumption and overall costs, including those associated with materials and installation. In addition, a smaller sized scanner requires less space for installation, thereby minimising the footprint of the scanner. This can be a critical consideration when installing scanners in modern hospitals.

In this specification, adjectives such as first and second, left and right, top and bottom, and the like may be used solely to distinguish one element or action from another element or action without necessarily requiring or implying any actual such relationship or order. Where the context permits, reference to an integer or a component or step (or the like) is not to be interpreted as being limited to only one of that integer, component, or step, but rather could be one or more of that integer, component, or step, etc.

The above detailed description of various embodiments of the present invention is provided for purposes of description to one of ordinary skill in the related art. It is not intended to be exhaustive or to limit the invention to a single disclosed embodiment. As mentioned above, numerous alternatives and variations to the present invention will be apparent to those skilled in the art of the above teaching. Accordingly, while some alternative embodiments have been discussed specifically, other embodiments will be apparent or relatively easily developed by those of ordinary skill in the art. The invention is intended to embrace all alternatives, modifications, and variations of the present invention that have been discussed herein, and other embodiments that fall within the spirit and scope of the above described invention.

In this specification, the terms 'comprises', 'comprising', 'includes', 'including', or similar terms are intended to mean a non-exclusive inclusion, such that a method, system or apparatus that comprises a list of elements does not include those elements solely, but may well include other elements not listed.

Throughout the specification and claims (if present), unless the context requires otherwise, the term "substantially" or "about" will be understood to not be limited to the specific value or range qualified by the terms.

The invention claimed is:

1. A gradient coil system suitable for use in an MRI system, the gradient coil system comprising:
    a gradient body having a bore extending therethrough, at least one frustoconical portion arranged about the bore and one or more cylindrical portions arranged about the bore wherein each of the cylindrical portions adjoins one or more of the at least one frustoconical portions, wherein a diameter of a first end of the bore is greater than a diameter of a second end of the bore, wherein the diameter of the first end of the bore is greater than 500 mm, and
    a gradient coil assembly arranged about the bore, the gradient coil assembly having at least one frustoconical section substantially conforming to the at least one frustoconical portion of the body and at least one cylindrical section, wherein each cylindrical section adjoins one or more of the frustoconical sections, the gradient coil assembly generating high efficiency gradient fields in a Diameter of Spherical Volume (DSV) for medical imaging, and
    wherein the gradient coil assembly includes two frustoconical sections and an angle of a first of the two frustoconical sections is between 0 and 10 degrees and an angle of a second of the two frustoconical sections is between 5 and 30 degrees with respect to a longitudinal axis of the body.

2. The gradient coil system in accordance with claim 1, wherein a first cylindrical portion of the one or more cylindrical portions having a diameter adjoins a second cylindrical portion of the one or more cylindrical portions having a diameter, wherein the diameter of the first cylindrical portion is greater than the diameter of the second cylindrical portion.

3. The gradient coil system in accordance with claim 1, wherein the gradient body comprises a plurality of frustoconical portions and/or a plurality of cylindrical portions defining a stepped-diameter bore.

4. The gradient coil system in accordance with claim 1, wherein the gradient coil assembly comprises:
    a primary coil structure having at least one substantially frustoconical section, wherein the primary coil structure comprises first, second and third primary coil segments generating three orthogonal linear primary gradient fields in the DSV, wherein the first primary coil segment generates a gradient field along a z-axis, the second primary coil segment generates a gradient field along an x-axis and the third primary coil segment generates a gradient field along a y-axis, wherein the first primary coil segment comprises an axial coil generating a first primary gradient field along a longitudinal axis that corresponds to the z-axis, and wherein the second and third primary coil segments each comprise a transverse coil rotated through 90 degrees in respect to each other thereby generating a second and third primary gradient field orthogonal to each other and the first primary gradient field; and a shield layer structure having at least one substantially frustoconical section corresponding to the at least one frustoconical section of the primary coil structure.

5. The gradient coil system in accordance with claim 4, wherein the shield layer structure comprises a first, second and third shield coil segment, and wherein each of the coil segments of the shield layer structure are arranged to generate an orthogonal gradient field opposite to the gradient field generated by a corresponding segment of the primary coil structure, thereby actively shielding the primary gradient fields and reducing eddy currents in a magnet and in the DSV, wherein the first shield coil segment generates a gradient field along the x-axis, the second primary coil segment generates a gradient field along the y-axis and the third primary coil segment generates a gradient field along the z-axis.

6. The gradient coil system in accordance with claim 5, wherein the shield layer structure is provided around the primary coil structure and extends substantially along an axial length of the bore, and wherein a diameter of each of the shield coil segments is greater than a diameter of any one of the primary coil segments.

7. The gradient coil system in accordance with claim 6, wherein the polarity of the coils of the primary coil structure is opposite to the polarity of the respective coils of the shield layer structure.

8. The gradient coil system in accordance with claim 4, wherein the system further comprises one or more shim pockets and a shim portion located in each shim pocket, whereby in use the shim portions passively shim the DSV to achieve a predetermined field (Bo) homogeneity level.

9. The gradient coil system in accordance with claim 8, wherein the shim portion comprises ferrous or ferromagnetic material.

10. The gradient coil system in accordance with claim 8, wherein each primary coil segment of the gradient coil assembly has an associated shim pocket and shim portion having a shape conforming to a shape of the primary coil segment.

11. The gradient coil system in accordance with claim 8, wherein the system further comprises one or more active magnetic shimming devices.

12. The gradient coil system in accordance with claim 1, wherein a length of the second of the two frustoconical sections is greater than a length of the first of the two frustoconical sections to increase efficiency and linearity of the magnetic field gradient.

13. The gradient coil system in accordance with claim 5, wherein the coil segments of the primary coil structure are arranged in the following order from adjacent the bore to adjacent the shield layer structure: the first primary coil segment, the second primary coil segment and the third primary coil segment and the coil segments of the shield layer structure are arranged in the following order from adjacent the primary coil layer to adjacent a magnet surrounding the gradient coil assembly: the first shield coil segment, the second shield coil segment and the third shield coil segment.

14. The gradient coil system in accordance with claim 1, wherein the bore comprises two frustoconical sections corresponding to the two frustoconical sections of the gradient coil assembly.

15. The gradient coil system in accordance with claim 1, wherein the gradient coil assembly comprises three-stepped cylindrical sections, wherein each cylindrical section has a different diameter, and wherein the bore comprises three-stepped cylindrical sections conforming to the three-stepped cylindrical section of the gradient coil assembly.

16. The gradient coil system in accordance with claim 15, wherein the gradient coil assembly comprises a frustoconical section extending between two of the cylindrical sections.

17. The gradient coil system in accordance with claim 1, wherein the gradient coil system further comprises one or more Radio Frequency (RF) coils are located between the gradient coil assembly and the bore, wherein the RF coils are frustoconical and/or cylindrical conforming to a shape of the bore and the RF coils are located on an inner surface of the body surrounding the bore.

18. The gradient coil system in accordance with claim 1, wherein the DSV has dimensions of 300 mm(x-)x300 mm(y-)x300 mm(z-).

19. The gradient coil system in accordance with claim 1, wherein the gradient body is located within a chamber of a magnet.

* * * * *